United States Patent
Ishizaki

(10) Patent No.: US 7,208,755 B2
(45) Date of Patent: Apr. 24, 2007

(54) LIGHT-EMITTING DEVICE AND METHOD OF FABRICATING THE SAME

(75) Inventor: Jun-ya Ishizaki, Annaka (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 0 days.

(21) Appl. No.: 10/550,298

(22) PCT Filed: Mar. 16, 2004

(86) PCT No.: PCT/JP2004/003498

§ 371 (c)(1),
(2), (4) Date: Sep. 22, 2005

(87) PCT Pub. No.: WO2004/086521

PCT Pub. Date: Oct. 7, 2004

(65) Prior Publication Data

US 2006/0220029 A1  Oct. 5, 2006

(30) Foreign Application Priority Data

Mar. 27, 2003 (JP) .............................. 2003-087395

(51) Int. Cl.
*H01L 29/06* (2006.01)
(52) U.S. Cl. .................. 257/22; 257/43; 257/E33.001
(58) Field of Classification Search ................. 257/12, 257/22, 43
See application file for complete search history.

(56) References Cited

U.S. PATENT DOCUMENTS

| | | | |
|---|---|---|---|
| 6,057,561 A * | 5/2000 | Kawasaki et al. ............ | 257/94 |
| 6,674,098 B1 * | 1/2004 | Niki et al. ................... | 257/102 |
| 6,982,438 B2 * | 1/2006 | Ishizaki ....................... | 257/103 |
| 7,091,526 B2 * | 8/2006 | Ishizaki ....................... | 257/101 |
| 2002/0025594 A1 * | 2/2002 | Iwata et al. .................. | 438/46 |
| 2004/0051109 A1 * | 3/2004 | Ishizaki et al. ............... | 257/89 |
| 2005/0242357 A1 * | 11/2005 | Uematsu et al. .............. | 257/94 |

(Continued)

FOREIGN PATENT DOCUMENTS

JP          08-236872          9/1996

(Continued)

*Primary Examiner*—Thao X. Le
*Assistant Examiner*—Mursalin B. Hafiz
(74) *Attorney, Agent, or Firm*—Snider & Associates; Ronald R. Snider

(57) ABSTRACT

A light emitting device 1 has formed therein a light emitting layer section 24 based on a double heterostructure in which a p-type cladding layer 34, an active layer 33 and an n-type cladding layer 32, individually composed of a $Mg_aZn_{1-a}O$ ($0 \leq a \leq 1$) type oxide, are stacked in this order, and uses a face on the n-type cladding layer side as a light extraction surface. The device also has, as being provided on the main surface on the light extraction surface side of the n-type cladding layer 32, an n-type low resistivity layer 35 composed of a $Mg_aZn_{1-a}O$ type oxide, and having a content of an n-type dopant larger than that in the n-type cladding layer 32. There is thus provided a light emitting device of $Mg_aZn_{1-a}O$-type oxide base, excellent in the light extraction efficiency, having the light emitting layer section composed of a $Mg_aZn_{1-a}O$-type oxide, and a high conductivity MgZnO-base compound semiconductor layer disposed on the light extraction surface side.

28 Claims, 5 Drawing Sheets

U.S. PATENT DOCUMENTS

2006/0081873 A1 * 4/2006 Osinsky et al. ............. 257/183

FOREIGN PATENT DOCUMENTS

| JP | 10-098214 | 4/1998 |
|---|---|---|
| JP | 2001-044500 | 2/2001 |
| JP | 2001-77411 | 3/2001 |
| JP | 2002-170993 | 6/2002 |
| JP | 2002-329888 | 11/2002 |
| JP | 2002-359396 | 12/2002 |
| JP | 2003-069076 | 3/2003 |

* cited by examiner

LIGHT-EMITTING DEVICE AND METHOD OF FABRICATING THE SAME

FIELD OF THE INVENTION

This invention relates to a light emitting device using semiconductor, in particular to a light emitting device suitable for emission of blue light or ultraviolet radiation, and a method of fabricating the same.

BACKGROUND ART

High luminance light emitting devices capable of short-wave emission in the blue light region have long been expected, and this sort of light emitting devices have recently realized by using AlGaInN-base materials. Rapid progress has also been made in application to full-color light emitting devices and display devices, based on combination with red and green high luminance light emitting devices. AlGaInN-base materials cannot, however, avoid increase in the cost because they are mainly composed of Ga and In, which are relatively rare-existing metals. Another big problem is that the material need growth temperature of as high as 700 to 1,000° C., causing a considerably large energy consumption for the manufacture. This is undesirable not only from a viewpoint of cost reduction, but also because it is against the current public situation where energy saving and suppression of the global warming are extensively discussed. Japanese Laid-Open Patent Publication No. 2001-44500 discloses a light emitting device configured by growing a more inexpensive MgZnO-base compound semiconductor layer grown in a hetero-epitaxial manner on a sapphire substrate.

Growth of the MgZnO-base oxide by vapor phase growth process such as MOVPE (metal organic vapor phase epitaxy) process under an atmosphere with a reduced pressure is, however, likely to produce oxygen deficiency causative of excessive electrons, and this make it difficult to form a p-type or intrinsic-semiconductor-type (also referred to as "i-type" taking the first letter of "intrinsic") MgZnO-base oxide layer which is indispensable for composing the light emitting device.

Many of conventional light emitting devices are configured by placing a p-type cladding layer on the light extraction surface side. A metal electrode disposed on the p-type cladding layer side in this case is formed so as to cover only a part of the light extraction surface thereof, so as not to interfere light extraction as possible. It is also generally accepted to preliminarily grow, on the p-type cladding layer, a current spreading layer which is raised in the in-plane conductivity through a heavy doping of a p-type dopant, and then to form the metal electrode on the current spreading layer, in order to prevent the emission drive current from concentrating in regions around the metal electrode.

As for the light emitting device using the ZnO-base compound semiconductor, even preparation of the p-type semiconductor having a conductivity as large as the cladding layer level is not easy due to influence of the above-described oxygen deficiency, so that it is readily predicted that a far larger difficulty will be encountered in preparation of a high conductivity MgZnO-base compound semiconductor increased in the p-type dopant concentration as being suited for current spreading, and this will make the light emitting device disadvantageous in every aspects of quality, performance, yield ratio and production efficiency.

A subject of the this invention therefore is to provide a $Mg_aZn_{1-a}O$-base light emitting device excellent in the light extraction efficiency, having a light emitting layer section composed of a $Mg_aZn_{1-a}O$-type oxide, and a high conductivity MgZnO-base compound semiconductor layer disposed on the light extraction surface side thereof.

SUMMARY OF THE INVENTION

Aiming at solving the aforementioned problems, a light emitting device of the this invention is such as having formed therein a light emitting layer section based on a double heterostructure in which a p-type cladding layer, an active layer and an n-type cladding layer, individually composed of a $Mg_aZn_{1-a}O$ ($0 \leq a \leq 1$) type oxide, are stacked in this order, the device using a face on the n-type cladding layer side as a light extraction surface, and having, as being provided on the main surface on the light extraction surface side of the n-type cladding layer, an n-type low resistivity layer composed of a $Mg_aZn_{1-a}O$ ($0 \leq a \leq 1$) type oxide, and having a content of an n-type dopant larger than that in the n-type cladding layer.

In the light emitting device structure having the p-type cladding layer located on the light extraction surface side, it is of course necessary for a low resistivity layer formed thereon, used for current spreading, to have p-type conductivity. The $Mg_aZn_{1-a}O$-type oxide, however, needs a highly sophisticated technology to be obtained as a p-type semiconductor, raising a considerable difficulty in obtaining in particular a high conductivity p-type semiconductor. A specific requirement for obtaining the p-type $Mg_aZn_{1-a}O$-type oxide relates to reduction in electron density in the oxide. One idea of reducing the electron density relates to compensation of electrons with holes. This is a strategy of obtaining i-type and p-type oxides through compensation of the donors, by doping a p-type dopant (acceptor) such as Li, capable of producing holes, into the $Mg_aZn_{1-a}O$-type oxide. The electron density ascribable to the oxygen deficiency may however reach as maximum as an order of $10^{19}$ cm$^{-3}$ or above, so that any efforts of completely compensating such a large amount of electrons by uniform doping of a p-type dopant and of producing excessive holes for further reduction in the resistivity for current spreading will inevitably require addition of a large amount of p-type dopant to as much as exceeding the electron density. Addition of such a large amount of p-type dopant results in formation of coarse heterogeneous crystal mainly composed of the p-type dopant in the MgZnO crystal, and makes it impossible to obtain the p-type $Mg_aZn_{1-a}O$-type oxide having good quality.

The light emitting device of this embodiment was therefore configured as using a face on the n-type cladding layer side as a light extraction surface, and as having an n-type low resistivity layer composed of a MgZnO-type oxide on the main surface on the light extraction surface side of the n-type cladding layer. The n-type MgZnO-type oxide can far more readily be prepared, because oxygen deficiency, which was not desirable in the p-type oxide, can effectively be used as an n-type carrier generation source. It is therefore almost unnecessary to compensate p-type carrier even when the low resistivity layer for current spreading is formed, so that it is made possible to readily obtain a high quality n-type oxide having sufficiently low resistivity suitable for current spreading, while suppressing the amount of addition of an n-type dopant to a relatively low level.

In this case, it is allowable to provide a bonding pad made of a metal so as to cover a part of the main surface of the n-type low resistivity layer. Because adoption of this invention makes it possible to form the low resistivity layer for current spreading with a high quality, the emission drive current supplied from the bonding pad may uniformly be spread over the surface of the n-type low resistivity layer. This successfully allows the light emitting layer section to uniformly and efficiently emit light just under the light extraction surface, and to obtain a high luminance light emitting device of MgZnO-type oxide base.

In view of obtaining a sufficient level of current spreading effect, sheet resistance of the n-type low resistivity layer is preferably suppressed to as small as approximately $1 \times 10^{16}$ $\Omega/cm^2$. The sheet resistance could be reduced by thickening the n-type low resistivity layer, but this may result in a lowered productivity, so that the thickness is preferably set to 0.1 µm to 10 µm for example, both ends inclusive.

Effective n-type carrier concentration of the n-type low resistivity layer is preferably adjusted to $1 \times 10^{17}/cm^3$ to $1 \times 10^{20}/cm^3$, both ends inclusive. The effective n-type carrier concentration less than $1 \times 10^{17}/cm^3$ may result in only an insufficient level of reduction in the sheet resistance, and that exceeding $1 \times 10^{20}/cm^3$ may result in a distinct formation of a heterogeneous phase ascribable to the excessive addition of the n-type dopant, and may undesirably result in a lowered emission luminance due to absorption of light or the like. Based on similar reasons, n-type dopant concentration of the n-type low resistivity layer is preferably adjusted $1 \times 10^{17}/cm^3$ to $1 \times 10^{20}/cm^3$, both ends inclusive. Any one of, or two or more of B, Al, Ga and In can be used as the n-type dopant contained in the n-type low resistivity layer. The n-type low resistivity layer can be grown as a $Mg_aZn_{1-a}O$-type oxide layer typically by MOVPE process, while incorporating therein the n-type impurity in the growth step. On the other hand, the n-type low resistivity layer can be formed also by initially being grown in vapor phase in a form of a $Mg_aZn_{1-a}O$-type oxide layer having an n-type dopant concentration lower than the final n-type dopant concentration, and then by allowing the n-type dopant to additionally diffuse therein from the main surface of the layer.

The n-type cladding layer may be configured as being intentionally added with the n-type dopant, or may be configured without intentional addition of the n-type dopant if a necessary level of conductivity can be ensured by oxygen deficiency in the crystal.

Various structural sophistication can be made on the active layer and the p-type cladding layer, in order to obtain intrinsic or p-type semiconductor with good quality. For example, it is allowable to adopt a configuration in which a p-type oxide layer, which is different from $Mg_aZn_{1-a}O$-type oxide and shows p-type conductivity, is inserted in a MgZnO layer composing the active layer or the cladding layer. In this configuration, the p-type oxide layer locally presents in the MgZnO layer can participate in functions of absorbing and compensating electrons, so that it is no more necessary to add a large amount of p-type dopant, it is made possible to obtain a p-type or i-type $Mg_aZn_{1-a}O$-type oxide with good quality, and it is consequently made possible to realize a ultraviolet or blue light emitting device of high emission luminance. Although there is no specific limitation on the number of layers of the p-type oxide layer, it is of course preferable that the electron compensation effect can be exhibited uniformly over the entire MgZnO layer in expectation of a high emission luminance. For this purpose, it is preferable to form a plurality of p-type oxide layers in a distributed manner, for example in a periodic manner, in the thickness-wise direction of the MgZnO layer. As the p-type oxide layer, a layer mainly composed of any of CuO, NiO and LiO can be used. For the case where CuO is adopted, a part of Cu may be substituted by a Group III element such as Ga, or by a Group II element such as Sr.

In the p-type cladding layer, it is allowable to form a high concentration doped layer having a p-type dopant concentration larger than an average concentration of the p-type cladding layer, as having a zonal width of not larger than a single-molecular layer of the p-type cladding layer (so-called δ doped layer). By forming the high concentration doped layer containing a p-type dopant, in the p-type cladding layer, so as to attain a zonal width of not larger than a single-molecular layer of the p-type cladding layer, the p-type dopant are, as it were, localized in the thickness-wise direction. Because the high-concentration doped layer, which is the localized layer of the p-type dopant, can function as absorbing and compensating electrons, it is no more necessary to add a large amount of p-type dopant, and thereby the p-type cladding layer having good quality can be obtained. The-high-concentration doped layer is also advantageous in that it is less likely to produce mismatched heterogeneous interface and dislocation, which are causative of scattering of carriers, because the layer is formed as having a zonal width of not larger than a single-molecular layer of the p-type cladding layer, in place of forming a coarse heterogeneous crystal grains as an aggregates of the p-type dopant.

In the light emitting device of this invention, $Mg_aZn_{1-a}O$-type oxide can be formed by vapor phase growth process. Recognizing now possibility of adoption of sputtering process and MBE process for example, adoption of MOVPE process raises advantages described below. MOVPE process allows free adjustment of oxygen partial pressure during growth processes, and is therefore capable of effectively suppressing oxygen elimination and oxygen deficiency by increasing pressure of a growth atmosphere to a certain extent. This consequently makes it possible to realize a p-type $Mg_aZn_{1-a}O$ layer indispensable for the light emitting device, in particular a p-type $Mg_aZn_{1-a}O$ layer having an oxygen deficiency concentration suppressed to $10/cm^3$ or below. The lower oxygen deficiency concentration is the better (that is, the oxygen deficiency concentration is not precluded from falling to $0/cm^3$).

Growth of the p-type cladding layer and the active layer by MOVPE process is successful in effectively suppressing oxygen deficiency during the film growth, when it is proceeded in an atmosphere with a pressure of 1 Torr ($1.3 \times 10^2$ Pa) or above, and in obtaining the p-type cladding layer or the active layer with good quality. In this case, it is more preferable to adjust the oxygen pressure (any oxygen-containing molecules other than $O_2$ also included after converting the contained oxygen into $O_2$) to 1 Torr ($1.3 \times 10^2$ Pa) or above.

On the other hand, use of MBE process is not so successful in suppressing oxygen deficiency as compared with the above-described MOVPE process, because the p-type cladding layer or the active layer is grown under a super-high vacuum (ca. $10^{-10}$ Torr), but is advantageous in that the layer can be controlled on the atomic layer basis. This consequently makes it possible to improve the crystallinity of the p-type cladding layer or the active layer, and use of MBE process further makes it possible to control the p-type oxide layer and/or high concentration doped layer inserted in the p-type cladding layer in this invention in a highly precise manner, and thereby to form a p-type cladding layer with a more improved quality.

For the purpose of fabricating the light emitting device of this invention, a method of fabricating a light emitting device of this invention is characterized in that, in the process of formation of the light emitting layer section having a double heterostructure by growing, in vapor phase, the p-type cladding layer, the active layer and the n-type cladding layer, individually composed of a $Mg_aZn_{1-a}O$ ($0 \leq a \leq 1$) type oxide, sequentially in this order, the device after formation of the p-type cladding layer is annealed in an oxidative gas atmosphere, and that the active layer and the n-type cladding layer are then grown in vapor phase. By annealing the p-type cladding layer in an oxidative gas atmosphere, and then by growing the active layer and the succeeding layer, it is made possible to more effectively suppress oxygen deficiency in the p-type cladding layer, and to obtain the p-type cladding layer with a higher quality through improvement in the crystallinity.

BEST MODES FOR CARRYING OUT THE INVENTION

The following paragraphs will describe best modes for carrying out this invention, referring to the attached drawings.

Figure 1:
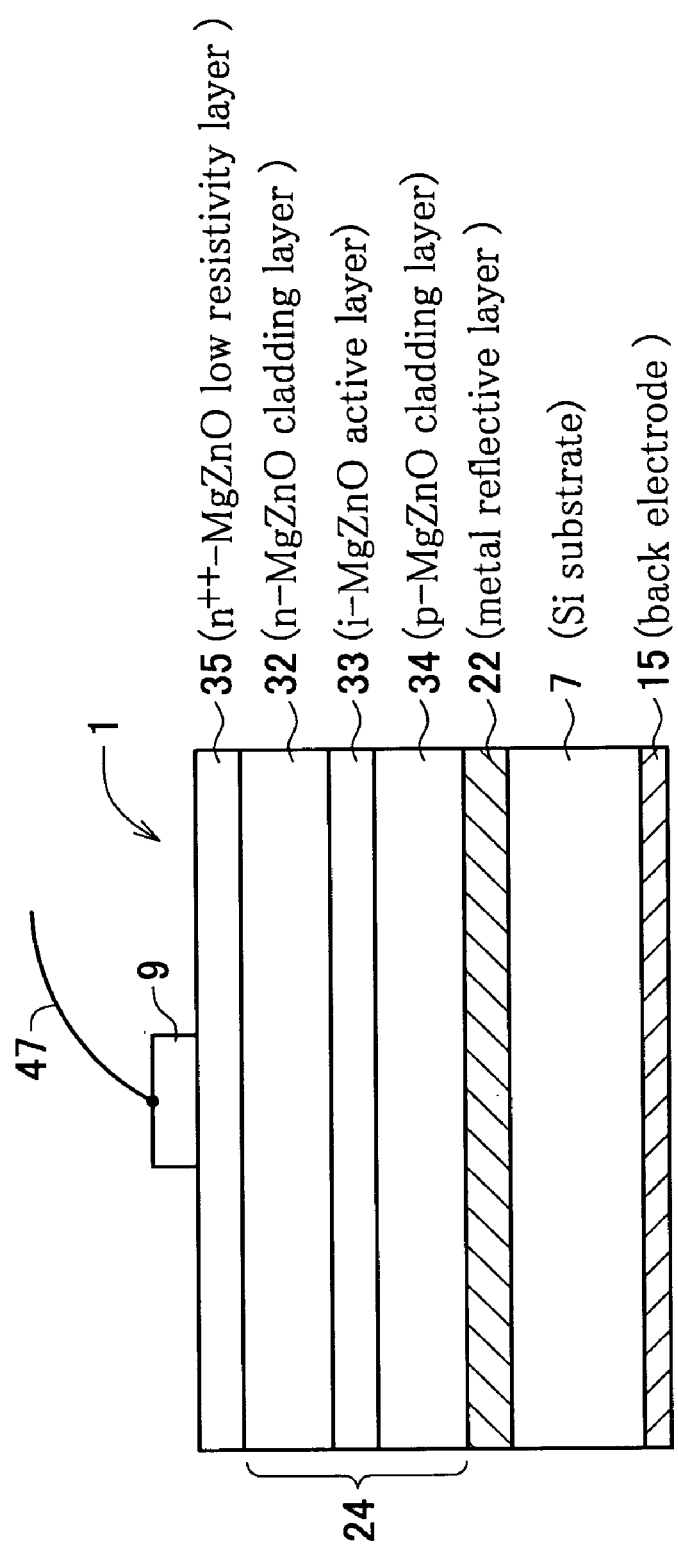
FIG. 1 is a schematic drawing showing, in a form of stacked structure, a specific example of the light emitting device of this invention.

FIG. 1 schematically shows, in a form of stacked structure, an essential portion of a light emitting device 1 as one embodiment of this invention, having a light emitting layer section 24 in which an n-type cladding layer 32, an active layer 33 and a p-type cladding layer 34 are stacked in this order. Each of the layers 32 to 34 is formed as a $Mg_aZn_{1-a}O$-type oxide layer ($0 \leq a \leq 1$: also referred to as MgZnO hereinafter: it is to be noted that a notation MgZnO includes concepts of both of simple oxides MgO and ZnO, as is obvious from the variable range for alloy composition "a").

The light emitting device 1 uses a face on the n-type cladding layer 32 side a light extraction surface, and has, as being formed on the main surface on the light extraction surface side of the n-type cladding layer 32, an n-type low resistivity layer 35 composed of a $Mg_aZn_{1-a}O$-type oxide ($0 \leq a \leq 1$) and having a content of an n-type dopant larger than that in the n-type cladding layer. At the near-center of the main surface of the n-type low resistivity layer 35, a bonding pad 9 made of a metal such as Au is disposed so as to cover a part of the main surface. The bonding pad 9 has an electrode wire 47 for current supply connected thereto.

On the other hand, the back side of the light emitting layer section 24 (p-type cladding layer 34 side) is covered with a metal reflective layer 22 composed of a metal such as Ag (Au or Al also allowable), and thereon a Si substrate 7, which is a conductive substrate, is bonded while placing the metal reflective layer 22 in between. The back surface of the Si substrate 7 is covered with a back electrode 15 composed of a metal such as Au.

MgZnO has wurtzite structure, in which oxygen atom layers and metal atom (Zn ion or Mg ion) layers are alternately stacked in the direction of c-axis. All of the individual layers 34, 33, 32, 35 are grown in the direction of c-axis. Omission of oxygen ions from the MgZnO crystal causes oxygen deficiency, and produces an electron as an n-type carrier. In the n-type cladding layer 32, the oxygen deficiency occurred only to an appropriate degree can positively be utilized as an electron source, rather than being hazardous. On the contrary in the p-type cladding layer 34 and the active layer 33, too much formation of the oxygen deficiency prevents the layers from showing p-type conductivity of intrinsic semiconductor property due to an increased amount of n-type carriers, so that it is important to suppress the oxygen deficiency.

The n-type cladding layer 32 is adjusted in the n-type carrier concentration thereof within a range from $1 \times 10^{17}$/cm$^3$ to $1 \times 10^{20}$ cm$^3$, so as to optimize emission recombination in the active layer 33. Any one of, or two or more of B, Al, Ga and In can be added as the n-type dopant, whereas it is also allowable to intentionally produce the oxygen deficiency, which can serve as an n-type carrier (electron) source, to thereby dispense with the dopants.

The n-type low resistivity layer 35 functions as a current spreading layer, and has any one of, or two or more of B, Al, Ga and In, among these Al in this embodiment, intentionally added thereto as an n-type dopant. The n-type low resistivity layer 35 has a thickness of 0.1 μm to 10 μm, both ends inclusive, and the sheet resistance thereof is adjusted to $1 \times 10^{16}$ Ω/cm$^2$ or below, in order to obtain a sufficient level of current spreading effect. The effective n-type carrier concentration is adjusted to $1 \times 10^{17}$/cm$^3$ to $5 \times 10^{19}$/cm$^3$, both ends inclusive, and the concentration of n-type dopant to be intentionally added is adjusted to $1 \times 10^{17}$/cm$^3$ to $5 \times 10^{19}$/cm$^3$, both ends inclusive.

On the other hand, the p-type cladding layer 34 contains a trace amount of any one of, or two or more of N, Ga, Al, In and Li as a p-type dopant. The p-type carrier concentration is adjusted within a range from $1 \times 10^{16}$/cm$^3$ to $8 \times 10^{18}$/cm$^3$, and in particular from $10^{17}$/cm$^3$ to $10^{18}$/cm$^3$.

The active layer 33 uses a material having an appropriate band gap corresponding to desired emission wavelength. For example, a material used for visible light emission is selected from those having band gap energies Eg (approximately from 3.10 eV to 2.18 eV), capable of light emission at a wavelength ranging from 400 nm to 570 nm. The wavelength range in the above covers violet to green regions, and for a particular case of blue light emission, those having band gap energies Eg (approximately from 2.76 eV to 2.48 eV) capable of light emission at wavelength ranging from 450 nm to 500 nm are selected. For ultraviolet emission, those having band gap energies Eg (approximately from 4.43 eV to 3.10 eV) capable of light emission at wavelength ranging from 280 nm to 400 nm are selected.

In the active layer 33, a value of alloy composition y is also recognized as a factor determining the band gap energy. For ultraviolet emission at a wavelength ranging from 280 nm to 400 nm, for example, the value is selected within a range of $0 \leq y \leq 0.5$. It is also preferable that band edge discontinuity formed between both cladding layers 32, 34 is preferably adjusted within a range from 0.1 eV to 0.3 eV or around for light emitting diode, and from 0.25 eV to 0.5 eV for semiconductor laser light source. This value can be determined by selecting the individual values of alloy for composition x, y and z the p type MgZnO layer 34, which can be expressed as the p-type $Mg_xZn_{1-x}O$ layer 34 with x, the MgZnO active layer 33, which can be expressed as the $Mg_yZn_{1-y}O$ layer 34 with y, and the n type MgZnO layer 32, which can be expressed as the n-type $Mg_zZn_{1-z}O$ layer 32 with z.

Figure 3:
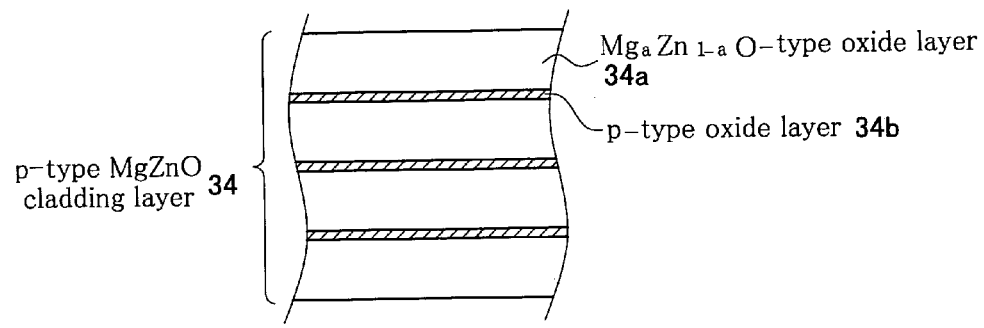
FIG. 3 is a schematic drawing showing the p-type cladding layer of the light emitting device shown in FIG. 1.

In this embodiment, as shown in FIG. 3, the-p-type cladding layer 34 has, as being inserted therein, p-type oxide layers 34b typically composed of CuO, NiO or LiO, which is different from the $Mg_aZn_{1-a}O$-type oxide. With the p-type oxide layers 34b, p-type doped $Mg_aZn_{1-a}O$-type oxide layers 34a are alternately stacked. Adoption of this sort of structure allows electrons, residing as background carriers in the p-type cladding layer 34, to be absorbed and compensated in the p-type oxide layers 34b, and makes it possible to obtain a desirable p-type conduction characteristic even at a lowered p-type dopant concentration in the $Mg_aZn_{1-a}O$-type oxide layers 34a. This consequently makes the heterogeneous domains, having the p-type dopant concentrated therein, less likely to be formed, and makes it possible to obtain the p-type or i-type MgZnO oxide layer with good quality.

Thickness of each of the p-type oxide layers 34b is adjusted to as thin as being capable of exhibiting quantum effect, so that the layers would not function as a light emitting layer making use of tunneling effect. On the other hand, each of the $Mg_aZn_{1-a}O$-type oxide layers 34a in contact with the p-type oxide layers 34b corresponds to a kind of barrier layer, and is necessarily characterized as a bulk crystal, so that, in contrast, the thickness thereof is adjusted to 15 nm or more, so as to prevent any influences ascribable to the tunneling effect from becoming distinctive.

The p-type oxide differs from MgZnO both in the crystal structure and lattice constants. On the other hand, the p-type oxide layers 34b must be formed in the p-type cladding layer 34 in a lattice matched manner with the $Mg_aZn_{1-a}O$-type oxide layers 34a, otherwise the carriers would be scattered due to dislocation and so forth, and this would result in a lowered emission efficiency. In this case, an excessively large thickness of the p-type oxide layers 34b may cause lattice relaxation, may result in lattice mismatching with respect to the $Mg_aZn_{1-a}O$-type oxide layers 34a in contact with the p-type oxide layers 34b, and may be causative of undesirably producing threading dislocation in the layers grown thereafter. To avoid the nonconformity, it is necessary to form the p-type oxide layers 34b to a thickness as thin as not causative of lattice relaxation (critical thickness) during formation of the p-type oxide layers 34b, and more specifically to as thin as 20 nm or less. In an exemplary case-where the p-type oxide layers 34b are configured using CuO or NiO, having a critical thickness of 3 to 5 molecular layers necessary for lattice matching with MgZnO, it is preferable to adjust the thickness of each of the p-type oxide layers 34b within a range from a single-molecular layer to 3-to-5 molecular layers, so as not to exceed the critical thickness, and to adjust the thickness of each of the MgZnO layers 34a in contact with the p-type oxide layers 34b to 20 nm or less, typically 15 nm or around.

There is no specific limitation on the number of layers of the p-type oxide layers 34b, wherein it is of course preferable, in view of expecting a high emission efficiency, that the electron compensation effect can uniformly appear in the target MgZnO layer. For this purpose, it is preferable, as shown in FIG. 3, to form two or more layers, that is, a plurality of p-type oxide layers 34b in a distributed manner, for example in a periodic manner, in the thickness-wise direction of the p-type cladding layer 34. For the case where a plurality of the p-type oxide layers 34b are thus formed, it is preferable to adjust the thickness of each of the p-type oxide layers 34b and each of the $Mg_aZn_{1-a}O$-type oxide layers 34a alternately stacked therewith within the above-described ranges.

The light emitting device 1 shown FIG. 1 can emit light when applied with voltage under a polarity of the bonding pad 9 side set to negative, and the back electrode 15 side set to positive. The emission drive current is supplied to the light emitting layer section 24 after being spread in plane over the n-type low resistivity layer 35. Flux of emitted light from the active layer 33 is extracted from a light extraction area defined around the bonding pad 9. On the other hand, flux of emitted light from the active layer 33 directed to the back side is reflected on the metal reflective layer 22, and is extracted as being overlaid with the flux of emitted light on the light extraction surface side. The n-type low resistivity layer 35 herein has a band gap energy set larger than that of the active layer 33, and is nearly transparent to the flux of emitted light.

The following paragraphs will describe an exemplary process of fabricating the light emitting device. First as shown in step 1 of FIG. 2, a buffer layer 11 composed of ZnO is formed on a sapphire substrate 10. Next, the n-type low resistivity layer 35, the n-type cladding layer 32, the active layer 33 and the p-type cladding layer 34 are epitaxially grown in this order. Epitaxial growth of each of these layers can be proceeded by the above-described MOVPE process or MBE process. The MOVPE process will be described below.

By MOVPE process, the buffer layer 11, the n-type low resistivity layer 35, the n-type cladding layer 32, the active layer 33 and the p-type cladding layer 34 can successively be formed in a single reaction chamber. The temperature in the reaction chamber can be adjusted by a heating source (infrared lamp in this embodiment) so as to promote chemical reactions for the layer growth. Examples of the major source materials for growing the individual layers include:

oxygen source: preferably supplied in a form of oxidative compound gas in view of suppressing an excessive reaction with organometallic compounds described later, although oxygen gas is allowable, typified by $N_2O$, NO, $NO_2$, CO and $H_2O$ where $N_2O$ (nitrous oxide) adopted in this embodiment;

Zn source gas: dimethyl zinc (DMZn), diethyl zinc (DEZn), etc.;

Mg source gas: bis-cyclopentadienyl magnesium ($Cp_2Mg$), etc.;

Cu source gas: copper hexafluoroacetyl acetonate;

Ni source gas: cyclopentadienyl nickel, methylcyclopentadienyl nickel; and

Li source gas: n-butyl lithium, etc.

Among these, the Cu source gas, Ni source gas and Li source gas are source gases for the p-type oxide.

Examples of the p-type dopant gas include the followings:

Li source gas: n-butyl lithium, etc.;

Si source gas: silicon hydrides such as monosilane;

C source gas: hydrocarbons (alkyl having one or more C atoms); and

Se source gas: hydrogen selenide, etc.

One of, or two or more of Al, Ga and In, which are Group III elements, can be allowed to function as excellent p-type dopants when coadded with N, which is a Group V element. Examples of the dopant gas include the followings:

Al source gas: trimethyl aluminum (TMAl), triethyl aluminum (TEAl), etc.;
Ga source gas: trimethyl gallium (TMGa), triethyl gallium (TEGa), etc.; and
In source gas: trimethyl indium (TMIn), triethyl indium (TEIn), etc.

For the case where nitrogen (N) is used as a p-type dopant together with a metal element (Ga), the p-type cladding layer is grown in vapor phase while supplying a gas which serves as an N source together with an organometallic gas which serves as a Ga source. In particular in this embodiment, $N_2O$ used as an oxygen component source also serves as an N source. It is also allowable to use an organic metal, such as monomethylhydrazine, as an N source.

On the other hand, the n-type conductivity of the n-type cladding layer 32 can be obtained by intentionally producing oxygen deficiency by reducing the oxygen partial pressure during the growth, or can be obtained by singularly adding a Group III element such as B, Al, Ga or In as an n-type dopant. As for Al, Ga and In, the dopant gases described in the above in relation to the p-type dopant are similarly available. As for B, diborane ($B_2H_6$) can typically be used.

The individual source gases are fed into the reaction chamber after being appropriately diluted with a carrier gas (nitrogen gas, for example). Ratio of flow rates of the organometallic compound gases MO which respectively serves as Mg source and Zn source is controlled using mass flow controllers (MFC) or the like, corresponding to variety in the alloy composition of the individual layers. Also flow rates of $N_2O$, which is an oxygen source gas, and a dopant source gas are controlled by the mass flow controllers (MFC).

The buffer layer 11 is grown as descried in the next. The substrate 10 on which the layers are grown is a sapphire (i.e., single-crystalline alumina) substrate having the a-axis as the principal crystal axis, wherein the main surface on the oxygen atom surface side is used as a layer growth surface. Prior to the layer growth, the substrate 10 is thoroughly-annealed under an oxidative gas atmosphere. The oxidative gas may be any of those selected from $O_2$, CO and $N_2O$, from which $N_2O$ is selected in this embodiment so as to be used also as the oxygen source gas in the layer growth described later. For the case where the annealing is carried out in the reaction chamber for MOVPE process, the annealing is preferably carried out at an annealing temperature of 750° C. or above (but lower than the melting point of the substrate), over a holding time of 30 minutes or more. It is, however, also allowable to shorten the above-described annealing time if the surface of the substrate can be cleaned to a satisfactory level by wet cleaning or the like.

After completion of the annealing, the substrate temperature is lowered to a first temperature which is set to 250 to 350° C. (set to 350° C. in this embodiment) in order to suppress generation of the deficiency, while keeping the oxidative gas atmosphere unchanged. After the temperature is stabilized at a set value, supply of the oxidative gas is interrupted, and the gas is then thoroughly purged out by replacing the inner atmosphere of the reaction chamber with nitrogen gas. It is preferable to set the purging time to 5 seconds or longer, which is variable depending on the geometry and capacity of the reaction chamber.

Figure 2:
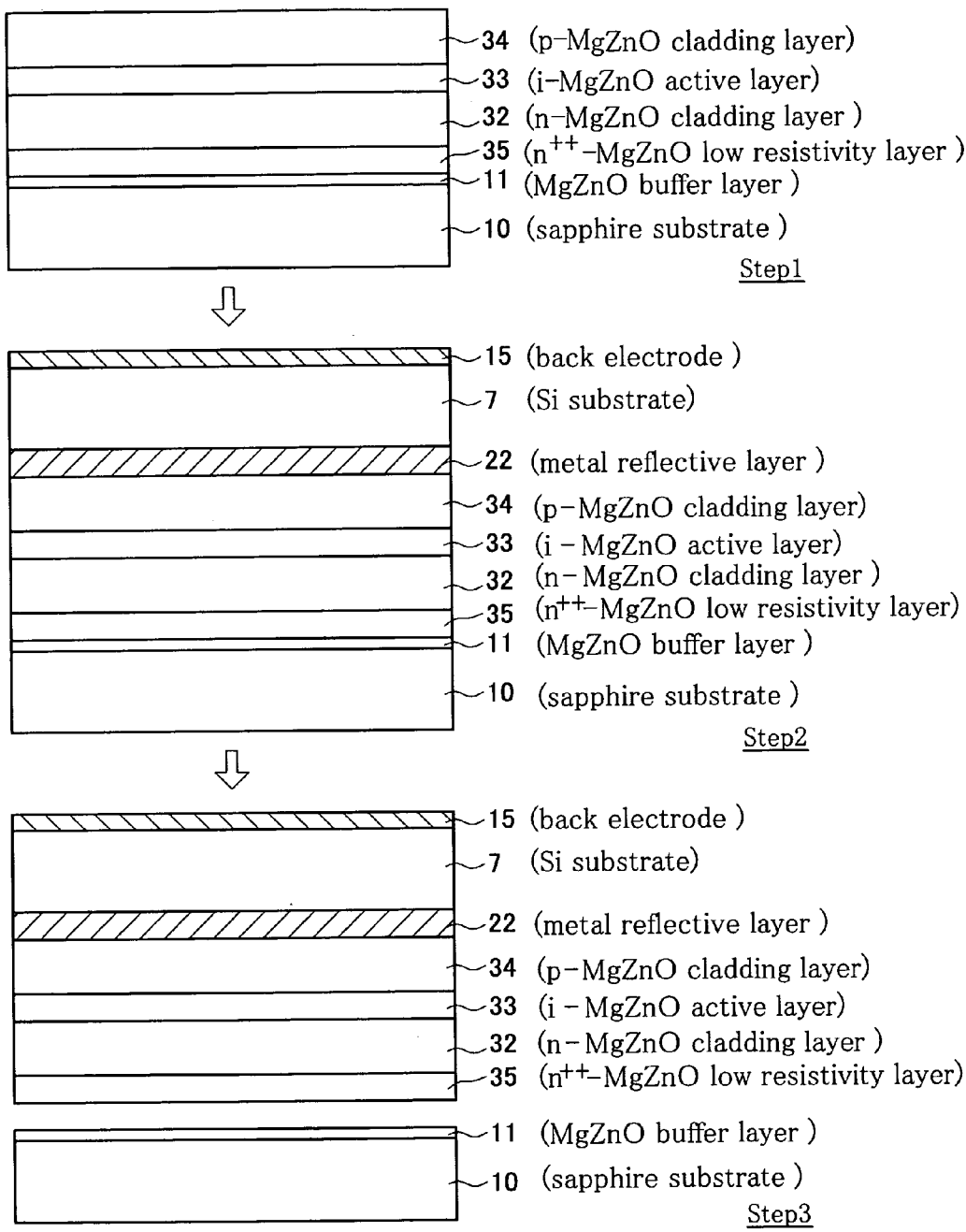
FIG. 2 is an explanatory drawing showing an exemplary fabrication process of the light emitting device shown in FIG. 1.

Next, the organometallic gas MO is supplied into the reaction chamber, and the first metal atomic layer which composes a part of the buffer layer 11 typically shown in FIG. 2 is formed as a mono-atomic metal layer by the ALE (atomic layer epitaxy) process. Growth of a metal atomic layer in the ALE process saturates once a single-atomic layer is completed based on the self-termination mechanism, and further growth of the metal atomic layer would not occur even under a continued supply of the organometallic gas MO. Thereafter the supply of the organometallic gas MO is interrupted, the gas is thoroughly purged out by replacing the inner atmosphere of the reaction chamber with nitrogen gas, $N_2O$ is introduced as the oxygen source gas (and also as a gas for creating the oxidative atmosphere), and a single-atomic layer of the oxygen atom layer is formed by the ALE process. This results in the formation of only a single-molecular layer of the MgZnO layer on the substrate 10.

The temperature in the reaction chamber is thereafter elevated to a second temperature which is set to 400 to 800° C. (set to 750° C. in this embodiment) while keeping the oxidative gas atmosphere unchanged, and by continuously supplying the organometallic gas (metal source gas), the residual portion of the buffer layer is formed by the general MOVPE process. In view of obtaining the buffer layer excellent both in the crystallinity and planarity, it is also preferable to grow the first few or several molecular layers by the ALE process.

After completion of the formation of the buffer layer 11, the n-type low resistivity layer 35, the n-type cladding layer 32, the active layer 33 and the p-type cladding layer 34 are formed in this order by MOVPE process. The n-type cladding layer 32 is grown under an oxygen partial pressure set to normal pressure or below (760 Torr or below, for example), while intentionally creating oxygen deficiency. An n-type dopant gas in this process is supplied at a constant flow rate, while keeping a continuous supply of the source gases (metal source gas+oxygen source gas) for the $Mg_aZn_{1-a}O$-type oxide layer 32. By this process, the n-type low resistivity layer 35 is obtained as a layer composed of $Mg_aZn_{1-a}O$-type oxide uniformly doped with the n-type dopant. On the other hand, the n-type cladding layer 32 is formed as a layer having a resistivity higher than that of the n-type low resistivity layer 35, wherein the n-type dopant gas is not supplied at all, or supplied only at a flow rate set lower than that in the growth process of the n-type low resistivity layer 35.

Figure 4:
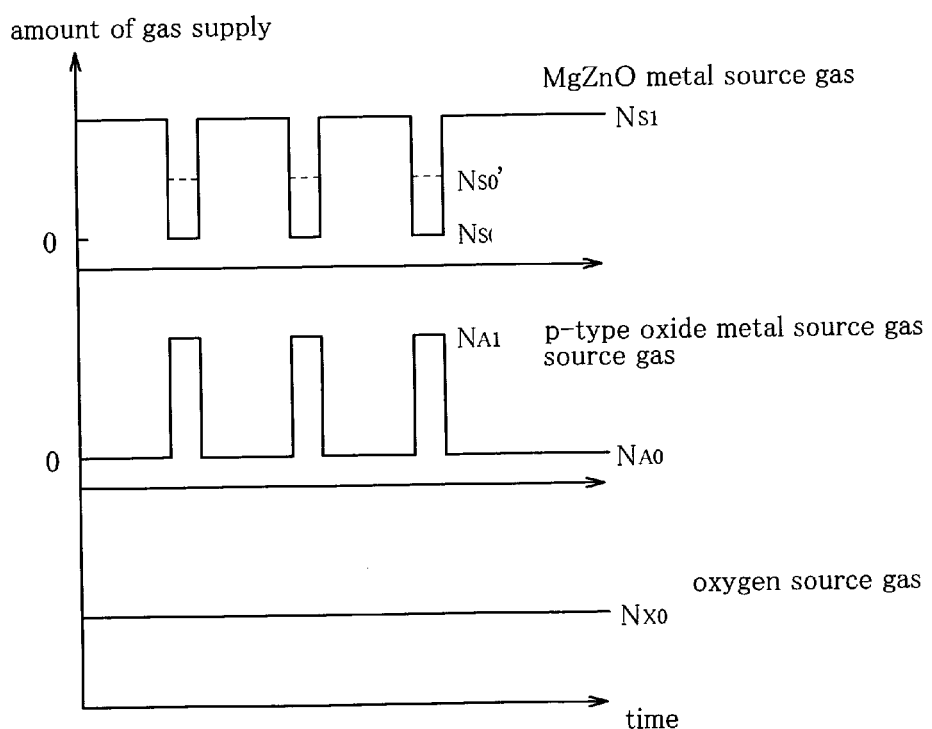
FIG. 4 is a schematic drawing showing an exemplary gas supply sequence, applied to formation of the p-type cladding layer shown in FIG. 3 by MOVPE process.

Thereafter, the active layer 33 and the p-type cladding layer 34 are grown in this order. The p-type cladding layer 34 must be grown so that the $Mg_aZn_{1-a}O$-type oxide layers 34a and the p-type oxide layers 34b are alternately stacked therein as shown in FIG. 3. FIG. 4 shows an exemplary gas supply sequence during the growth of the p-type cladding layer 34. In this sequence, the supply volume of the metal source gas for MgZnO is changed so that large-flow-volume periods having supply volume $N_{S1}$ and small-flow-volume periods having supply volume $N_{S0}$, smaller than $N_{S1}$, appear in an alternate manner, and the supply volume of the p-type metal source gas for the p-type oxide is changed so that small-flow-volume periods corresponded to the large-flow-volume periods of the metal source gas for MgZnO (flow volume: $N_{A0}$=0) and large-flow-volume periods corresponded to the small-flow-volume periods of the metal source gas for MgZnO (flow volume: $N_{A1}$) appear in an alternate manner. On the other hand, the oxygen source gas is supplied in a stationary manner at a predetermined flow volume $N_{XO}$. This allows an intermittent growth of the plurality of p-type oxide layers 34b during the growth of the p-type cladding layer 34.

When the p-type oxide layers 34b are grown in an intermittent manner, it is allowable to simultaneously proceed the growth of the p-type oxide layers 34b while keeping the growth of the $Mg_zZn_{1-z}O$-type oxide layers 34a uninterrupted. In this case, as shown in FIG. 4, the supply volume of the metal source gas for MgZnO is adjusted to a constant value $N_{SO}'$, but not zero, even during the small-flow-volume period. The p-type oxide layers 34b in this case will be formed as regions having the p-type oxide and MgZnO mixed therein.

On the other hand, it is also allowable to grow the p-type oxide layers 34b while keeping the growth of the $Mg_aZn_{1-a}O$-type oxide layers 34a interrupted. In FIG. 4, this means that the flow volume $N_{SO}$ of the metal source gas for MgZnO in the small-flow-volume period is fallen to zero. When the growth of the p-type oxide layers 34b is proceeded while interrupting the growth of the $Mg_aZn_{1-a}O$-type oxide layers 34a, period of the interruption can function as a kind of annealing period, and makes it possible to glow the p-type cladding layer 34 having an improved crystallinity and less defects. Generation of defects, such as oxygen deficiency, can more effectively be prevented if the supply of the metal source gas for MgZnO is interrupted, only the supply of the oxygen source gas is kept continued for a predetermined period, and is then switched to the supply of the metal source gas for p-type oxide.

During the growth of the $Mg_aZn_{1-a}O$-type oxide layers 34a, a p-type dopant is doped (co-addition of Ga and N, for example). The p-type dopant gas can be supplied at a constant flow rate while keeping the supply of the source gases (metal source gas+oxygen source gas) for the $Mg_aZn_{1-a}O$-type oxide layers 34a uninterrupted. This allows formation of the $Mg_aZn_{1-a}O$-type oxide layers 34a as being uniformly doped with the p-type dopant.

Figure 5:
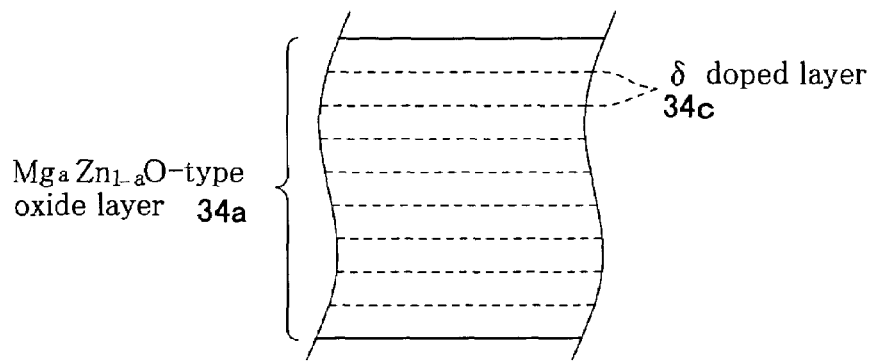
FIG. 5 is a schematic drawing showing a structure of a $Mg_aZn_{1-a}O$-type oxide layer δ-doped with a p-type dopant.

On the other hand, as shown in FIG. 5, it is also allowable to form high-concentration doped layers (referred to as "δ-doped layers", hereinafter) 34c having a p-type dopant concentration larger than the average concentration of the p-type cladding layer 34 (or $Mg_zZn_{1-z}O$-type oxide layers 34a), so as to have a zonal width not larger than a single-molecular layer of the $Mg_zZn_{1-z}O$-type oxide layers 34a. This configuration is successful in further enhancing the effect of reducing the background electron concentration and therefore in reducing the average p-type dopant concentration of the p-type cladding layer 34 as a whole, so that the emission efficiency can further be improved. The δ-doped layer 32c can further improve the electron compensating effect when two or more layers thereof are periodically formed in the $Mg_aZn_{1-a}O$-type oxide layers 34a.

The amount of supply of the p-type dopant in the δ-doped layer 34c is preferably adjusted so that the ratio of coverage by the p-type dopant gas falls within a range from 1/20 to 1/4 molecular layers. The coverage ratio of less than 1/20 molecular layers results in only an insufficient effect of reducing the background electron concentration. On the other hand, the coverage ratio exceeding 1/4 molecular layers tends to result in an excessive amount of addition of the p-type dopant, and consequently in a lowered emission efficiency. The interval of formation of the δ-doped layers 34c is preferably adjusted within a range from 10 to 500 molecular layers on the basis of the molecular layers of MgZnO layer 32a. The interval less than 10 molecular layers tends to result in an excessive amount of addition of the p-type dopant, and consequently in a lowered emission efficiency. On the other hand, the interval exceeding 500 molecular layers may result in only an insufficient effect of reducing the background electron concentration, or an insufficient attainment of the p-type conductivity.

Figure 6:
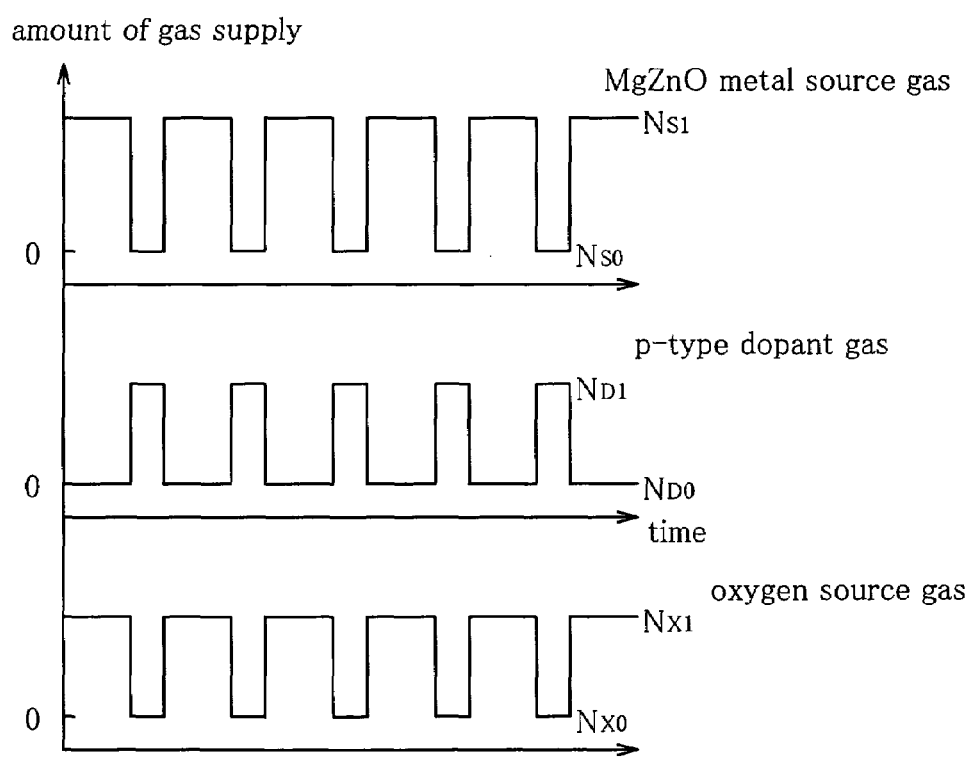
FIG. 6 is a schematic drawing showing an exemplary gas supply sequence applied to formation of the $Mg_aZn_{1-a}O$-type oxide layer shown in FIG. 5 by MOVPE process.

The δ-doped layers 34c can be formed by temporarily increasing the ratio of supply concentration of the p-type dopant gas to that of the source gas for $Mg_aZn_{1-a}O$-type oxide (metal source gas+oxygen source gas). Formation of a plurality of δ-doped layers 34c in a distributed manner in the thickness-wise direction is available by intermittently increasing the ratio of supply concentration of the p-type dopant gas. FIG. 6 shows an exemplary gas supply sequence for this case, in which the supply volume of the metal source gas for MgZnO is changed so that large-flow-volume periods with supply volume $N_{S1}$ and small-flow-volume periods with supply volume $N_{S0}$, smaller than $N_{S1}$, appear in an alternate manner; the supply volume of the oxygen source gas is changed so that large-flow-volume periods with supply volume $N_{X1}$ and small-flow-volume periods with supply volume $N_{X0}$, smaller than $N_{X1}$, appear in an alternate manner; and the p-type dopant gas is switched so that small-flow-volume periods corresponded to the large-flow-volume periods of the source gas for MgZnO (flow volume: $N_{D0}$) and large-flow-volume periods corresponded to the small-flow-volume periods of the same (flow volume: $N_{D1}$) appear in an alternate manner.

The effect of reducing the background electron concentration through the formation of the δ-doped layer 34c increases as changes in the p-type dopant concentration profile become sharper. To obtain this sort of profile, it is effective to interrupt the supply of the source gas for $Mg_zZn_{1-z}O$ during the formation of the δ-doped layer 34c. This specifically means that both of $N_{S0}$ and $N_{X0}$ in FIG. 6 are fallen to zero. It is preferable that also the flow rate $N_{D0}$ of the p-type dopant gas is fallen to zero during the non-formation period of the δ-doped layers 34c in view of making more sharp changes in the concentration profile. When the δ-doped layers 34c are formed in the $Mg_aZn_{1-a}O$-type oxide layer 34a, it is still also preferable to change the growth mode of the $Mg_aZn_{1-a}O$-type oxide layer 34a based on MOVPE process into the ALE mode, which is the same mode during the growth of the buffer layer 11, immediately before the supply of the p-type dopant gas. More specifically, at least the last one molecular layer of the $Mg_aZn_{1-a}O$-type oxide layer 34a immediately before the supply of the p-type dopant gas is formed by ALE so as to expect the self-termination, and then the p-type dopant gas is supplied. This is successful in obtaining an extremely sharp profile of the concentration change.

Figure 7:
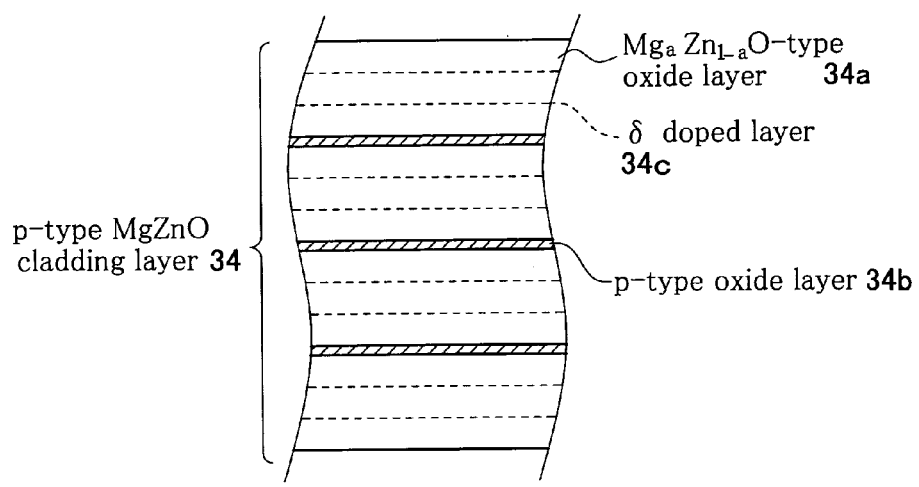
FIG. 7 is a schematic drawing showing a dual-periodic structure of a p-type cladding layer formed by δ-doped layers and p-type oxide layers.

FIG. 7 schematically shows a detailed structure of the p-type cladding layer 34 finally obtained by the method described in the above. This is, so to speak, a dual-periodical structure in which a plurality of δ-doped layers 34c are periodically formed in one $Mg_aZn_{1-a}O$-type oxide layer 34a, and the p-type oxide layers 34b are further periodically formed with respect the $Mg_aZn_{1-a}O$-type oxide layers 34a. This is successful in bringing out the best effect of reducing the background electron concentration, in exactly giving the p-type conductivity to the p-type cladding layer 34, and in improving the emission efficiency, and as a consequence, the luminance of the light-emitting device configured as shown in FIG. 1.

Figure 8:
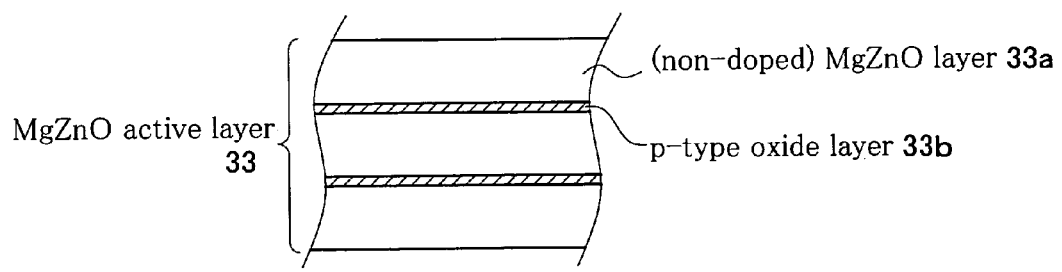
FIG. 8 is a schematic drawing showing an example of an active layer having p-type oxide layers periodically formed therein.

As shown in FIG. 8, also p-type oxide layers 33b can be formed in the active layer 33 in an absolutely similar manner, and this is contributable to reduction in the background electron concentration, and to further improvement in the emission efficiency. In this case, the entire portion of the active layer 33 necessarily has a conduction property of intrinsic semiconductor type (i-type), and $Mg_aZn_{1-a}O$-type oxide layers 33a are configured as non-doped layers.

During the growth of the active layer 33 and the p-type cladding layer 34, it is effective to keep the pressure inside the reaction chamber at 10 Torr or above in order to suppress generation of oxygen deficiency. This is successful in further suppressing elimination of oxygen, and in growing the MgZnO layer having only a less amount of oxygen deficiency. In particular for the case where $N_2O$ is used as the oxygen component source, the above-described setting of the pressure can prevent $N_2O$ from rapidly dissociating, and can suppress the generation of the oxygen deficiency in a more effective manner. The higher the pressure of the atmospheric rises, the larger the suppressive effect against the oxygen elimination becomes, wherein a sufficiently distinctive effect can be obtained under the pressure only as high as 760 Torr ($1.01 \times 10^5$ Pa, or 1 atm). In an exemplary case under 760 Torr or lower, it is advantageous that only a relatively simple structure of a sealing for the reaction chamber will suffice since the reaction chamber is kept at normal pressure or reduced pressure. On the other hand, adoption of the pressure exceeding 760 Torr means pressurizing of the internal of the chamber, and requires some tighter sealing so as to prevent the internal gas from leaking, and adoption of a considerably high pressure necessitates a pressure-proof structure, thereby more distinct effect of suppressing the oxygen elimination can be obtained. The upper limit of the pressure in this case should be determined at an appropriate value so as to keep a reasonable balance between cost for the apparatus and attainable suppressive effect against the oxygen elimination (e.g., 7,600 Torr ($1.01 \times 10^6$ Pa or 10 atm) or around).

It is also allowable to anneal the p-type cladding layer 34, after completion of formation thereof and before growth of the succeeding layers, in an oxidative gas atmosphere, and thereafter the active layer 33 and the n-type cladding layer 32 are grown in vapor phase. This makes it possible to more effectively suppress oxygen deficiency in the p-type cladding layer 34, and to obtain a high quality p-type cladding layer having a less amount of oxygen deficiency. It is still also allowable to anneal the active layer 33, after completion of formation thereof and before growth of the n-type cladding layer 32, in a similar oxidative gas atmosphere, thereby a high quality active layer can similarly be obtained. The annealing temperature may be set similarly to that for the layer growth. In this case, the annealing can be proceeded in an extremely simple manner by growing the p-type cladding layer 34 or the active layer 33 at a predetermined temperature, by interrupting supply of the source gases while keeping the temperature unchanged, and then by introducing an oxidative gas into the reaction chamber. The oxidative gas adoptable herein, other than $O_2$, include $N_2O$, NO, $NO_2$, CO and $H_2O$.

Referring now back to FIG. 2, after completion of the growth, the Si substrate having the back electrode 15 and the metal reflective layer 22 preliminarily formed thereon is stacked on the main back surface of the p-type cladding layer 34 to thereby bring them into a close contact as shown in step 2, and the stack is then bonded by further annealing at an appropriate temperature. On the other hand, the sapphire substrate 10 is removed together with the buffer layer 11 from the n-type low resistivity layer 35, the bonding pad 9 is formed typically by vapor evaporation on the surface exposed after the removal, and the electrode wire 47 is bonded thereto, to thereby obtain the light emitting device 1 shown in FIG. 1.

Although the individual layers described in the aforementioned method of fabrication are grown by MOVPE process, it is also allowable to adopt MBE process. In an exemplary case where an LiO layer is formed as the p-type oxide layer, or Li is used as the p-type dopant, it is also allowable to use a solid Li as a source material or a dopant source for forming the p-type oxide.

The invention claimed is:

1. A light emitting device having formed therein a light emitting layer section based on a double heterostructure in which a p-type cladding layer, an active layer and an n-type cladding layer, individually composed of a $Mg_aZn_{1-a}O$ ($0 \leq a \leq 1$) type oxide, are stacked in this order, the device using a face on the n-type cladding layer side as a light extraction surface, and having, as being provided on the main surface on the light extraction surface side of the n-type cladding layer, an n-type low resistivity layer composed of a $Mg_aZn_{1-a}O$ ($0 \leq a \leq 1$) type oxide, and having a content of an n-type dopant larger than that in the n-type cladding layer.

2. The light emitting device as claimed in claim 1, having a metal bonding pad provided so as to cover a part of the main surface of the n-type low resistivity layer.

3. The light emitting device as claimed in claim 1, wherein the n-type low resistivity layer has an effective carrier concentration of $1 \times 10^{17}/cm^3$ to $1 \times 10^{20}/cm^3$, both ends inclusive.

4. The light emitting device as claimed in claim 3, wherein the n-type low resistivity layer has an n-type dopant concentration of $1 \times 10^{17}/cm^3$ to $1 \times 10^{20}/cm^3$, both ends inclusive.

5. The light emitting device as claimed in claim 1, wherein the n-type low resistivity layer contains, as the n-type dopant, one of or more of B, Al, Ga and In.

6. The light emitting device as claimed in claim 1, wherein the n-type low resistivity layer is grown as a $Mg_aZn_{1-a}O$-type oxide layer by MOVPE process, while incorporating therein the n-type impurity in the growth step.

7. The light emitting device as claimed in claim 1, wherein the n-type low resistivity layer is obtained by initially being grown in vapor phase in a form of a $Mg_aZn_{1-a}O$-type oxide layer having an n-type dopant concentration lower than the final n-type dopant concentration, and then by allowing the n-type dopant to additionally diffuse therein from the main surface of the layer.

8. The method of fabricating a light emitting device as claimed in claim 1, wherein, in the process of formation of the light emitting layer section having a double heterostructure by growing, in vapor phase, the p-type cladding layer, the active layer and the n-type cladding layer, individually composed of a $Mg_aZn_{1-a}O$ ($0 \leq a \leq 1$) type oxide, sequentially in this order, the device after formation of the p-type cladding layer is annealed in an oxidative gas atmosphere, and the active layer and the n-type cladding layer are then grown in vapor phase.

9. The light emitting device as claimed in claim 2, wherein the n-type low resistivity layer has an effective carrier concentration of $1 \times 10^{17}/cm^3$ to $1 \times 10^{20}/cm^3$, both ends inclusive.

10. The light emitting device as claimed in claim 9, wherein the n-type low resistivity layer has an n-type dopant concentration of $1 \times 10^{17}/cm^3$ to $1 \times 10^{20}/cm^3$, both ends inclusive.

11. The light emitting device as claimed in claim 2, wherein the n-type low resistivity layer contains, as the n-type dopant, one or more of B, Al, Ga and In.

12. The light emitting device as claimed in claim 2, wherein the n-type low resistivity layer is grown as a $Mg_aZn_{1-a}O$-type oxide layer by MOVPE process, while incorporating therein the n-type impurity in the growth step.

13. The light emitting device as claimed in claim 2, wherein the n-type low resistivity layer is obtained by initially being grown in vapor phase in a form of a $Mg_aZn_{1-a}O$-type oxide layer having an n-type dopant concentration lower than the final n-type dopant concentration, and then by allowing the n-type dopant to additionally diffuse therein from the main surface of the layer.

14. The light emitting device as claimed in claim 3, wherein the n-type low resistivity layer is obtained by initially being grown in vapor phase in a form of a $Mg_aZn_{1-a}O$-type oxide layer having an n-type dopant concentration lower than the final n-type dopant concentration, and then by allowing the n-type dopant to additionally diffuse therein from the main surface of the layer.

15. The light emitting device as claimed in claim 9, wherein the n-type low resistivity layer is obtained by initially being grown in vapor phase in a form of a $Mg_aZn_{1-a}O$-type oxide layer having an n-type dopant concentration lower than the final n-type dopant concentration, and then by allowing the n-type dopant to additionally diffuse therein from the main surface of the layer.

16. The method of fabricating a light emitting device as claimed in claim 2, wherein, in the process of formation of the light emitting layer section having a double heterostructure by growing, in vapor phase, the p-type cladding layer, the active layer and the n-type cladding layer, individually composed of a $Mg_aZn_{1-a}O$ ($0 \leq a \leq 1$) type oxide, sequentially in this order, the device after formation of the p-type cladding layer is annealed in an oxidative gas atmosphere, and the active layer and the n-type cladding layer are then grown in vapor phase.

17. The method of fabricating a light emitting device as claimed in claim 3, wherein, in the process of formation of the light emitting layer section having a double heterostructure by growing, in vapor phase, the p-type cladding layer, the active layer and the n-type cladding layer, individually composed of a $Mg_aZn_{1-a}O$ ($0 \leq a \leq 1$) type oxide, sequentially in this order, the device after formation of the p-type cladding layer is annealed in an oxidative gas atmosphere, and the active layer and the n-type cladding layer are then grown in vapor phase.

18. The method of fabricating a light emitting device as claimed in claim 9, wherein, in the process of formation of the light emitting layer section having a double heterostructure by growing, in vapor phase, the p-type cladding layer, the active layer and the n-type cladding layer, individually composed of a $Mg_aZn_{1-a}O$ ($0 \leq a \leq 1$) type oxide, sequentially in this order, the device after formation of the p-type cladding layer is annealed in an oxidative gas atmosphere, and the active layer and the n-type cladding layer are then grown in vapor phase.

19. The method of fabricating a light emitting device as claimed in claim 4, wherein, in the process of formation of the light emitting layer section having a double heterostructure by growing, in vapor phase, the p-type cladding layer, the active layer and the n-type cladding layer, individually composed of a $Mg_aZn_{1-a}O$ ($0 \leq a \leq 1$) type oxide, sequentially in this order, the device after formation of the p-type cladding layer is annealed in an oxidative gas atmosphere, and the active layer and the n-type cladding layer are then grown in vapor phase.

20. The method of fabricating a light emitting device as claimed in claim 10, wherein, in the process of formation of the light emitting layer section having a double heterostructure by growing, in vapor phase, the p-type cladding layer, the active layer and the n-type cladding layer, individually composed of a $Mg_aZn_{1-a}O$ ($0 \leq a \leq 1$) type oxide, sequentially in this order, the device after formation of the p-type cladding layer is annealed in an oxidative gas atmosphere, and the active layer and the n-type cladding layer are then grown in vapor phase.

21. The method of fabricating a light emitting device as claimed in claim 5, wherein, in the process of formation of the light emitting layer section having a double heterostructure by growing, in vapor phase, the p-type cladding layer, the active layer and the n-type cladding layer, individually composed of a $Mg_aZn_{1-a}O$ ($0 \leq a \leq 1$) type oxide, sequentially in this order, the device after formation of the p-type cladding layer is annealed in an oxidative gas atmosphere, and the active layer and the n-type cladding layer are then grown in vapor phase.

22. The method of fabricating a light emitting device as claimed in claim 11, wherein, in the process of formation of the light emitting layer section having a double heterostructure by growing, in vapor phase, the p-type cladding layer, the active layer and the n-type cladding layer, individually composed of a $Mg_aZn_{1-a}O$ ($0 \leq a \leq 1$) type oxide, sequentially in this order, the device after formation of the p-type cladding layer is annealed in an oxidative gas atmosphere, and the active layer and the n-type cladding layer are then grown in vapor phase.

23. The method of fabricating a light emitting device as claimed in claim 6, wherein, in the process of formation of the light emitting layer section having a double heterostructure by growing, in vapor phase, the p-type cladding layer, the active layer and the n-type cladding layer, individually composed of a $Mg_aZn_{1-a}O$ ($0 \leq a \leq 1$) type oxide, sequentially in this order, the device after formation of the p-type cladding layer is annealed in an oxidative gas atmosphere, and the active layer and the n-type cladding layer are then grown in vapor phase.

24. The method of fabricating a light emitting device as claimed in claim 12, wherein, in the process of formation of the light emitting layer section having a double heterostructure by growing, in vapor phase, the p-type cladding layer, the active layer and the n-type cladding layer, individually composed of a $Mg_aZn_{1-a}O$ ($0 \leq a \leq 1$) type oxide, sequentially in this order, the device after formation of the p-type cladding layer is annealed in an oxidative gas atmosphere, and the active layer and the n-type cladding layer are then grown in vapor phase.

25. The method of fabricating a light emitting device as claimed in claim 7, wherein, in the process of formation of the light emitting layer section having a double heterostructure by growing, in vapor phase, the p-type cladding layer, the active layer and the n-type cladding layer, individually composed of a $Mg_aZn_{1-a}O$ ($0 \leq a \leq 1$) type oxide, sequentially in this order, the device after formation of the p-type cladding layer is annealed in an oxidative gas atmosphere, and the active layer and the n-type cladding layer are then grown in vapor phase.

26. The method of fabricating a light emitting device as claimed in claim 13, wherein, in the process of formation of the light emitting layer section having a double heterostructure by growing, in vapor phase, the p-type cladding layer, the active layer and the n-type cladding layer, individually composed of a $Mg_aZn_{1-a}O$ ($0 \leq a \leq 1$) type oxide, sequentially in this order, the device after formation of the p-type cladding layer is annealed in an oxidative gas atmosphere, and the active layer and the n-type cladding layer are then grown in vapor phase.

27. The method of fabricating a light emitting device as claimed in claim 14, wherein, in the process of formation of the light emitting layer section having a double heterostructure by growing, in vapor phase, the p-type cladding layer, the active layer and the n-type cladding layer, individually composed of a $Mg_aZn_{1-a}O$ ($0 \leq a \leq 1$) type oxide, sequentially in this order, the device after formation of the p-type cladding layer is annealed in an oxidative gas atmosphere, and the active layer and the n-type cladding layer are then grown in vapor phase.

28. The method of fabricating a light emitting device as claimed in claim 15, wherein, in the process of formation of the light emitting layer section having a double heterostructure by growing, in vapor phase, the p-type cladding layer, the active layer and the n-type cladding layer, individually composed of a $Mg_aZn_{1-a}O$ ($0 \leq a \leq 1$) type oxide, sequentially in this order, the device after formation of the p-type cladding layer is annealed in an oxidative gas atmosphere, and the active layer and the n-type cladding layer are then grown in vapor phase.

* * * * *